(12) United States Patent
Park et al.

(10) Patent No.: US 7,772,765 B2
(45) Date of Patent: Aug. 10, 2010

(54) DOUBLE-SIDED ORGANIC ELECTROLUMINESCENT DISPLAY HAVING OPTICAL SHUTTER AND INFORMATION TERMINAL USING THE SAME

(75) Inventors: Young-jong Park, Seoul (KR); June-young Song, Kyunggi-do (KR)

(73) Assignee: Samsung Mobile Display Co., Ltd., Nongseo-Dong, Giheung-Gu, Yongin, Gyunggi-Do (KR)

( * ) Notice: Subject to any disclaimer, the term of this patent is extended or adjusted under 35 U.S.C. 154(b) by 1019 days.

(21) Appl. No.: 11/124,395

(22) Filed: May 9, 2005

(65) Prior Publication Data

US 2005/0264190 A1 Dec. 1, 2005

(30) Foreign Application Priority Data

May 28, 2004 (KR) ...................... 10-2004-0038362

(51) Int. Cl.
H05B 33/00 (2006.01)
H05B 33/14 (2006.01)
(52) U.S. Cl. ..................................... 313/506
(58) Field of Classification Search .................. 313/506
See application file for complete search history.

(56) References Cited

U.S. PATENT DOCUMENTS 6,404,472 B1 * 6/2002 Andreatta et al. ........... 349/123
6,788,953 B1 * 9/2004 Cheah et al. .............. 455/550.1
2003/0063456 A1 * 4/2003 Katahira ...................... 362/27
2003/0112217 A1 * 6/2003 Lee ............................. 345/102
2005/0068304 A1 * 3/2005 Lewis et al. ................. 345/168

FOREIGN PATENT DOCUMENTS

| EP | 1515181 A1 * | 3/2005 |
|---|---|---|
| KR | 10-2003-0027717 | 4/2003 |
| KR | 10-2003-0058013 | 7/2003 |

OTHER PUBLICATIONS

Korean Office Action of the Korean Patent Application No. 2004-0038362, mailed on Feb. 7, 2006.

* cited by examiner

*Primary Examiner*—Nimeshkumar D Patel
*Assistant Examiner*—Anthony T Perry
(74) *Attorney, Agent, or Firm*—Robert E. Bushnell, Esq.

(57) ABSTRACT

A double-sided organic electroluminescent display is constructed with an optical shutter. The organic electroluminescent display which includes an image displaying part comprising a plurality of pixels to display an image corresponding to a data signal and a selection signal, an optical shutter provided on the image displaying part to transmit or block light in response to a control signal, and a driver circuit to supply the data and selection signals to the plurality of pixels and the control signal to the optical shutter, respectively is excellent in visual recognition.

17 Claims, 9 Drawing Sheets

DOUBLE-SIDED ORGANIC ELECTROLUMINESCENT DISPLAY HAVING OPTICAL SHUTTER AND INFORMATION TERMINAL USING THE SAME

CLAIM OF PRIORITY

This application claims the benefit of Korean Patent Application No. 2004-38362, filed on May 28, 2004, in the Korean Intellectual Property Office, the disclosure of which is incorporated herein by reference.

BACKGROUND OF THE INVENTION

1. Field of the Invention

The present invention relates to a double-sided organic electroluminescent display having an optical shutter, and to an information terminal using the same.

2. Discussion of Related Art

Generally, electroluminescence (EL) is a phenomenon that an exciton is created by an electron and a hole respectively injected from a cathode and an anode into one of a monomer inorganic layer, a monomer organic layer, a polymer inorganic layer, and a polymer organic layer, and emits light of a predetermined wavelength. The EL is classified into an inorganic EL and an organic EL according to materials.

The inorganic EL device is observed in a thin film type structure basically comprising an upper insulating layer, a lower insulating layer, and a fluorescent layer formed therebetween, or in a thick film type structure comprising a reflecting layer having an insulating material, and an insulating binder having a fluorescent material.

However, an EL device using the inorganic EL is characteristic of low brightness and low efficiency, and therefore is not suitable for application of a display. Thus, the EL device using the inorganic EL should be improved in its characteristic.

The organic EL device emits light when an exciton is transferred from an excited state to a ground state, wherein the exciton is created by combination of an electron and a hole respectively injected from a cathode and an anode into a light emitting layer. Such an organic EL device is employed in a flat panel display and allows the flat panel display to have advantages of low voltage drive, low power consumption, high brightness, self-illumination, fast response speed of several microseconds, wide-view angle, lightweight, thin thickness, low production cost, etc., so that it has been rapidly developed.

However, in the conventional double-sided organic EL display, opposite electrodes of the organic EL device are formed of the transparent electrodes. Therefore, while a user sees an image displayed on one side screen, the light transmitted through the other side screen makes it difficult to correctly see an image displayed on the screen.

Further, in an information terminal such as a mobile terminal, which comprises the conventional double-sided organic EL display, visual recognition of the display is easily affected and deteriorated by circumferential luminous intensity. For example, when the circumferential luminous intensity is relatively high, it is difficult to see an image displayed on the display panel of the mobile terminal.

Also, in the conventional information terminal, even though a user increases the brightness of the display panel when the circumferential luminous intensity is relatively high, the visual recognition is not enhanced. For example, when the conventional foldable mobile terminal comprising the double-sided organic EL display is used in daylight or in a bright place, the double-side of the image displaying part is exposed to bright light. Accordingly, it is difficult for a user to recognize the information displayed on the display panel even though a user increases the brightness of the display panel.

Thus, in the conventional double-sided organic EL display and the information terminal such as a mobile terminal using the same, visual recognition can be deteriorated by circumferential luminous intensity.

SUMMARY OF THE INVENTION

It is therefore an object of the present invention to provide an improved organic electroluminescent display and an improved information terminal.

It is an aspect of the present invention to provide a double-sided organic electroluminescent display having an optical shutter, and an information terminal using the same, in which the optical shutter prevents a circumferential image in the back from being projected onto a front side.

Another aspect of the present invention is to provide a double-sided organic electroluminescent display having an optical shutter, and an information terminal using the same, which are excellent in visual recognition even though circumferential luminous intensity is high.

The foregoing and/or other aspects of the present invention are achieved by providing an organic electroluminescent display comprising: an image displaying part comprising a plurality of pixels to display an image corresponding to a data signal and a selection signal; an optical shutter provided on the image displaying part to transmit or block light in response to a control signal; and a driver circuit to supply the data and selection signals to the plurality of pixels and the control signal to the optical shutter.

Another aspects of the present invention are achieved by providing an information terminal comprising: a double-sided organic electroluminescent image displaying part comprising a plurality of pixels to display an image corresponding to a data signal and a selection signal; an optical shutter disposed on the image displaying part to transmit or block light depending on a control signal; a driver circuit to transmit the data and selection signals to the plurality of pixels and the control signal to the optical shutter, respectively; a base band processor comprising a memory to store a predetermined program, and a processor connected to the memory to implement the program; and a radio frequency processor connected between the base band processor and an antenna.

According to an aspect of the invention, the organic electroluminescent display further comprises a sensor to detect a front side on state or a back side on state of the image displaying part and to transmit a sensed signal to the driver circuit.

According to an aspect of the invention, the organic electroluminescent display further comprises a housing to accommodate the image displaying part, the optical shutter, and the driver circuit.

According to an aspect of the invention, the sensor comprises a slide switch provided in the housing and outputting the sensed signal.

According to an aspect of the invention, the optical shutter comprises at least one of a polarizing modulation type liquid crystal, a scattering type liquid crystal, and an absorbing type liquid crystal.

According to an aspect of the invention, the optical shutter comprises: first and second glass substrates opposite to each other, leaving a predetermined space therebetween; first and second transparent electrodes formed between the first and second glass substrates; first and second alignment layers formed between the first and second transparent electrodes; and a liquid crystal injected to and filled in a cell formed between the first and second alignment layers.

According to an aspect of the invention, the optical shutter comprises a first optical shutter and a second optical shutter disposed in opposite surfaces of the image displaying part.

According to an aspect of the invention, the information terminal further comprises a user interface to set either an opaque state or a transparent state of the optical shutter.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF PREFERRED EMBODIMENTS

Figure 1:
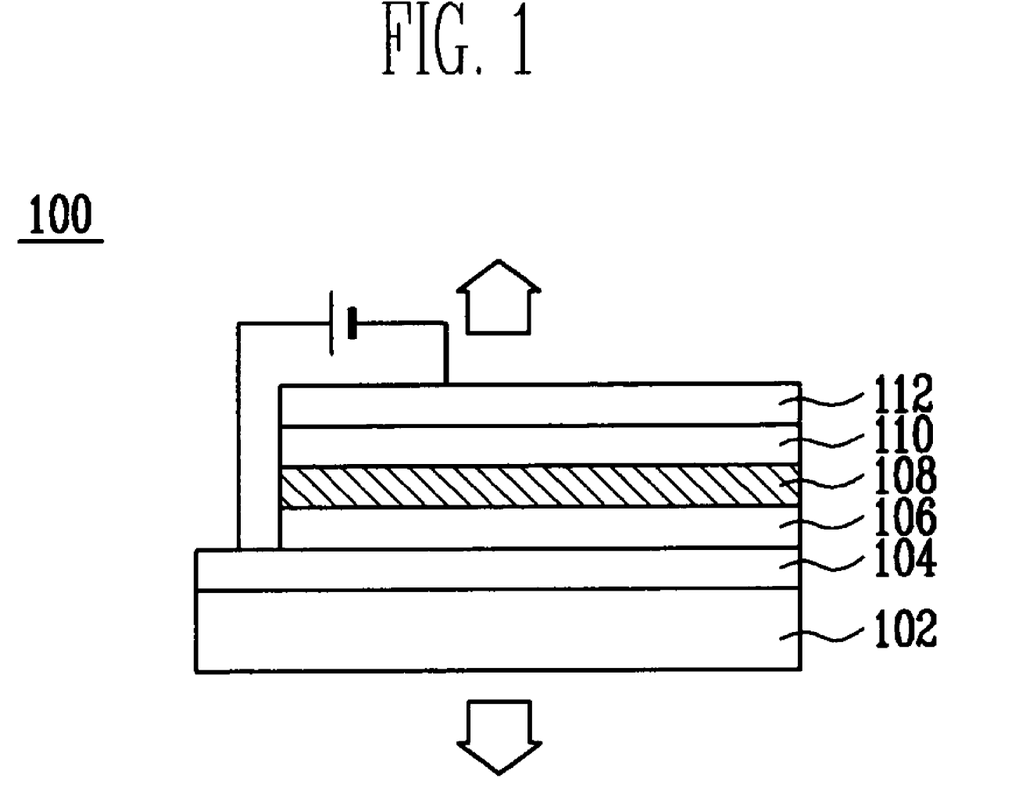
FIG. 1 is a schematic side sectional view of an organic EL device.

The organic EL device will be described in more detail with reference to FIG. 1. FIG. 1 is a schematic side sectional view of an organic EL device.

Referring to FIG. 1, an organic EL device 100 generally comprises a glass substrate 102, an anode 104, an emission layer 108, and a cathode 112. Further, the organic EL device 100 comprises a hole injecting layer 106, and an electron injecting layer 110 to enhance injecting characteristics of the electron and the hole. In the case of a double-sided emission structure, the anode 104 and the cathode 112 are formed of a transparent electrode such as an indium tin oxide (ITO) electrode. Additionally, the organic EL device 100 can comprise an electron transporting layer, a hole transporting layer, a hole blocking layer, etc. to enhance device characteristics. The organic EL device 100 emits light with brightness in proportion to intensity of current applied thereto.

Figure 2:
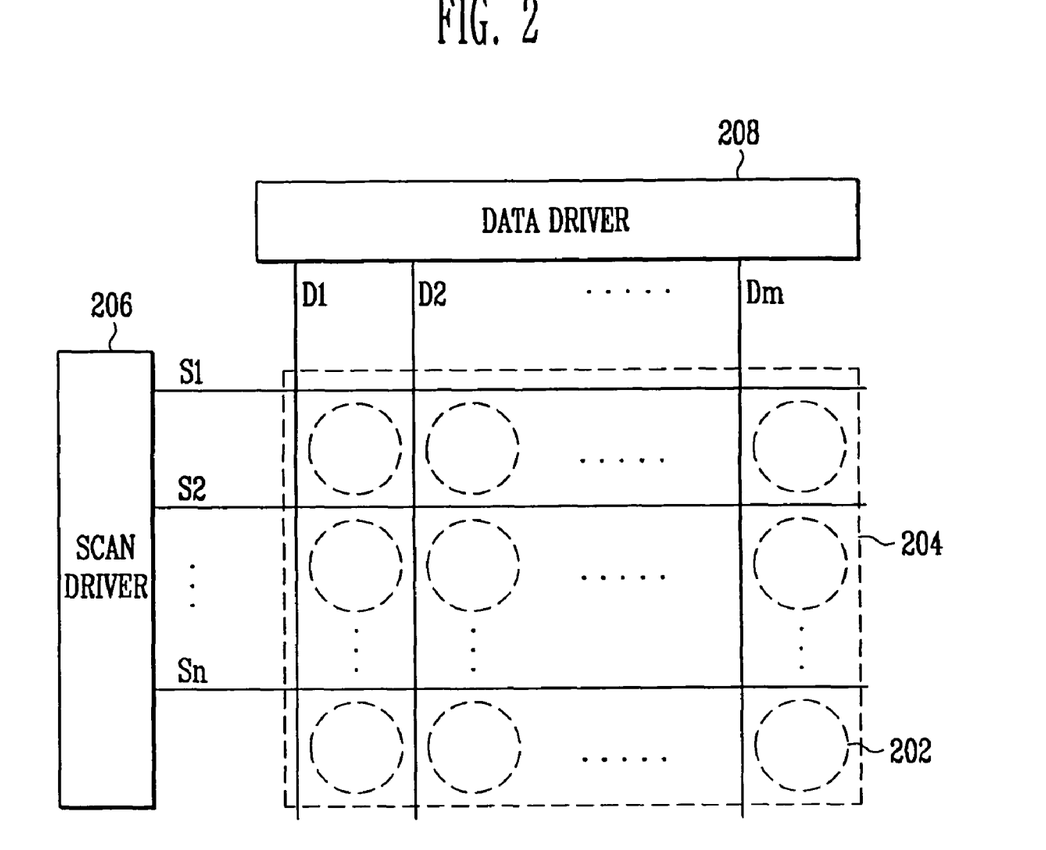
FIG. 2 is a schematic plan view of a conventional organic EL display.

FIG. 2 is a schematic plan view of a conventional organic EL display.

Referring to FIG. 2, the organic EL display 200 comprises an organic EL panel 204, a scan driver 206, and a data driver 208. The organic EL panel 204 comprises a plurality of scan lines S1 to Sn extending toward a first direction from the scan driver 206, a plurality of data lines D1 to Dm extending toward a second direction from the data driver 208, and a plurality of pixels 202. Here, the plurality of pixels 202 are formed in pixel regions defined by the plurality of scan lines S1 to Sn and the plurality of data lines D1 to Dm.

In the conventional organic EL display 200, the scan driver 206 controls scan signals for driving organic EL devices (not shown) provided in the pixels 202, and supplies the controlled scan signals to the scan lines S1 to Sn. The scan signals are transmitted to switching devices (not shown) provided in the pixels 202, and turns on/off the switching devices. The data driver 208 controls data voltage or current corresponding to a video signal for the pixels 202, and supplies the controlled data voltage or current to the data lines D1 to Dm. The pixels 202 comprise pixels representing red (R), green (G), blue (B) or white (W). With this configuration, the conventional double-sided organic EL display displays an image on a double-sided screen.

As stated above, however, opposite electrodes of the conventional double sided organic EL device are formed of the transparent electrodes. Therefore, while a user sees an image displayed on one side screen, the light transmitted through the other side screen makes it difficult to correctly see an image displayed on the screen.

Hereinafter, preferable embodiments according to the present invention will be described with reference to the accompanying drawings, wherein the preferred embodiments of the present invention are provided to be readily understood by those skilled in the art.

Figure 3:
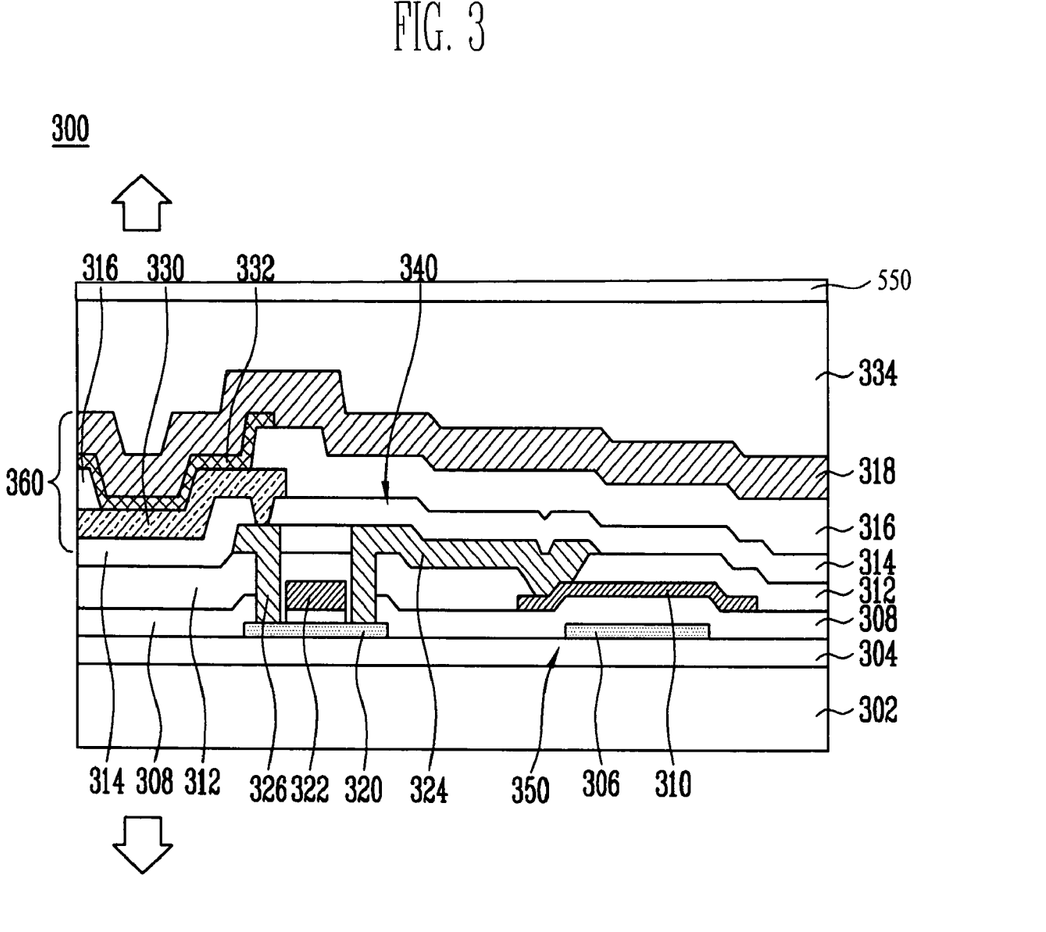
FIG. 3 is a partial section view of a double-sided organic EL display according to a first embodiment of the present invention.

FIG. 3 is a partial section view of a double-sided organic EL display according to a first embodiment of the present invention.

Referring to FIG. 3, an organic EL display 300 comprises a thin film transistor (TFT) 340 on an insulating substrate 302, a storage capacitor 350, an organic EL device 360, a glass can sealing 334, and an optical shutter 550.

The TFT 340 comprises a semiconductor layer 320 formed on a buffer layer 304 of the insulating substrate 302, a gate electrode 322 formed on the semiconductor layer 320, a source electrode 324, and a drain electrode 326. The source electrode 324 and the drain electrode 326 are connected to the semiconductor layer 320, respectively. The TFT 340 with this configuration forms a P-metal oxide semiconductor (PMOS) TFT. The buffer layer 304 protects the insulating substrate 302 from the foregoing layers formed on the insulating substrate 302, and functions as a buffer allowing the foregoing layers to be properly formed on the insulating substrate 302.

The storage capacitor 350 comprises a capacitor electrode 306 formed on the buffer layer 304, and a voltage supplying electrode 310 facing the capacitor electrode 306, leaving a first insulating layer 308 therebetween.

The organic EL device 360 comprises: an anode 330 that is formed on first through third insulating layers 308, 312, 314 sequentially formed on the buffer layer 304; an organic EL layer 332 formed on the anode 330; and a cathode 318 formed on the organic EL layer 332.

The first through third insulating layers 308, 312, 314 are formed with a contact hole to be connected to one another. The anode 330 and the cathode 318 are made of transparent material through which light emitted from the organic EL layer 332 passes, at least in a region facing the organic EL layer 332. Here, the cathode 318 is made of material having low work-function to easily inject an electron into the organic EL layer 332.

In the foregoing configuration, the anode 330 of the organic EL device 360 is connected to the drain electrode 326 of the TFT 340. Further, the source electrode 324 of the TFT 340 is connected to the voltage supplying electrode 310 of the storage capacitor 350. Here, a passivation layer 316 is formed between the cathode 318 and the third insulating layer 314. Further, the organic EL device 360 is sealed with the glass can sealing 334.

An inner space limited by the glass can sealing 334 is filled with gas such as $N_2$ or Ar. Further, the inner space may be additionally provided with a taper containing barium oxide or calcium oxide, or a powder-type moisture absorption agent.

The optical shutter 550 is formed on the glass can sealing 334. The optical shutter 550 is electrically connected to a driver circuit DRIVER IC of the double-sided organic EL display 300, and alternates between opaqueness and transparentness according to voltages applied between opposite terminals of the optical shutter. The optical shutter 550 shown in FIG. 3 is placed on the glass can sealing 334, but may be placed beneath the substrate 302. Here, the optical shutter 550 is formed to have proper thickness or configuration in consideration of transmissivity, reflectivity, etc. Hereinbelow, the optical shutter 550 will be described in more detail.

Figure 4:
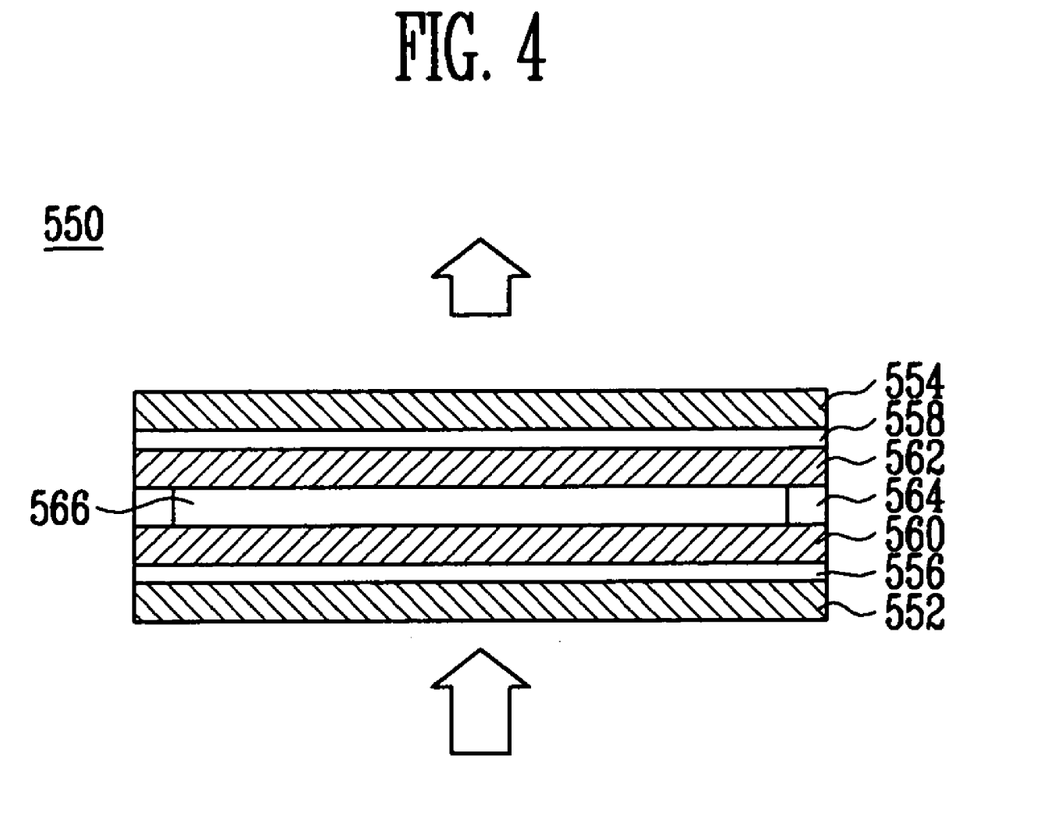
FIG. 4 is a sectional view showing an optical shutter of the double-sided organic EL display according to the first embodiment of the present invention.

FIG. 4 is a sectional view showing an optical shutter of the double-sided organic EL display according to the first embodiment of the present invention. In FIG. 4, the optical shutter comprises ferroelectric liquid crystal.

Referring to FIG. 4, the optical shutter 550 comprises: upper and lower glass substrates 552 and 554 facing each other; transparent electrodes 556 and 558 formed on inner surfaces of the glass substrates 552 and 554; and alignment layers 560 and 562 formed on inner surfaces of the transparent electrodes 556 and 558 to align liquid crystal material 566. Here, the liquid crystal material 566 is filled between the alignment layers 560 and 562.

Each pair of the glass substrates 552 and 554, the transparent electrodes 556, 558, and the alignment layers 560, 562 are spaced from each other and face each other at a predetermined distance by a spacer 564. The transparent electrodes 556 and 558 comprise a first transparent electrode 558 to which common voltage is applied, and a second transparent electrode 556 to which a predetermined control signal is applied to control a liquid crystal state.

The liquid crystal material 556 includes ferroelectric liquid crystal or antiferroelectric liquid crystal, and is filled between the transparent glass substrates 552 and 554 covered with the transparent electrodes 556 and 558. The liquid crystal material 566 includes liquid crystal mixture for satisfying physical properties of the liquid crystal device 550. The ferroelectric liquid crystal used in the optical shutter 550 rotates along a sematic layer forming a layer structure equivalent in electrical and magnetic properties, i.e., rotates drawing a contour of a virtual cone.

The ferroelectric liquid crystal is spontaneously polarized regardless of an external electric field, and has advantages that response speed is fast as compared with other liquid crystals, and view angle can be widen without a specific electrode structures or a compensation film. Further, the ferroelectric liquid crystal maintains a current mode as long as the external electric field is not applied thereto, thereby lowering power consumption for controlling the liquid crystal. With this configuration, the optical shutter 550 transmits or blocks the light emitted from the organic EL device according to the voltages applied to the opposite transparent electrodes 556 and 558.

The foregoing optical shutter 550 is illustrated as an example of an optical shutter comprising a liquid crystal device. The liquid crystal device used in the optical shutter 550 may be various liquid crystal devices including a polarizing modulation type, a scattering type, and an absorbing type. For example, the polarizing modulation type liquid crystal includes: a twisted nematic (TN) type liquid crystal classified into a 90-degree twisted nematic (TN) type, an STN type, a homeotropic to twisted planar (HTP) type, and an axially symmetric aligned microcell (ASM) type, etc.; the ferroelectric liquid crystal classified into an SSF type, an AF type, a DHF type, etc.; and an electrical controlled birefringence (ECB) type liquid crystal classified into optical controlled birefringence (OCB) type, a deformation of vertical aligned phase (DAP) type, an in plane switch (IPS) type. The scattering type liquid crystal includes a PD type liquid crystal, a dynamic scattering (DS) type liquid crystal, a polymer stabilized cholesteric texture (PSCT) type liquid crystal, etc. The absorbing type liquid crystal includes a gust host (GH) type liquid crystal.

Further, the optical shutter 550 can be set as one of a normally black (NB) mode and a normally white (NW) mode. At the NB mode, the optical shutter 550 blocks the light emitted from the organic EL device when voltage is not applied to the shutter 550, and transmits the light when threshold voltage or more is applied to the shutter 550. On the other hand, at the NW mode, the optical shutter 550 transmits the light emitted from the organic EL device when voltage is not applied to the shutter 550, and blocks the light when the threshold voltage or more is applied to the shutter 550.

Figure 5:
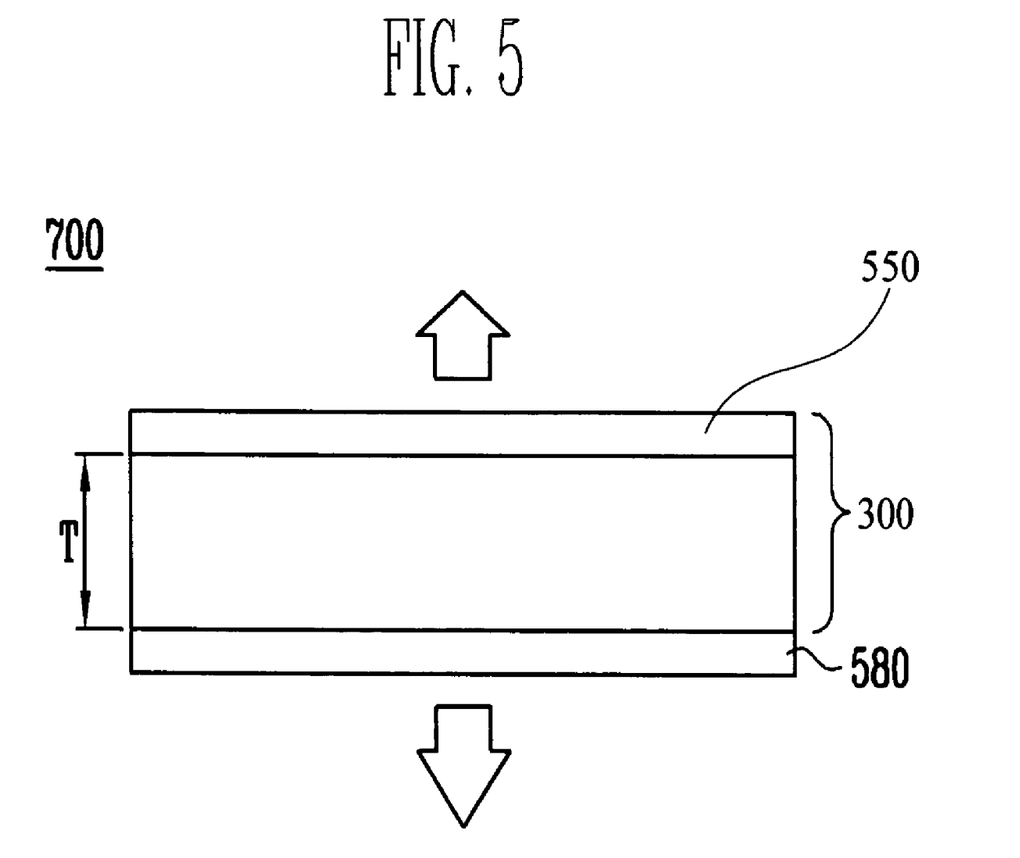
FIG. 5 is a schematic sectional view of a double-sided organic EL display according to a second embodiment of the present invention.

FIG. 5 is a schematic sectional view of a double-sided organic EL display according to a second embodiment of the present invention. In the second embodiment, like numerals refer to like elements as compared with the double-sided organic EL display according to the first embodiment of FIG. 3.

Referring to FIGS. 3 and 5, a double-sided organic EL display 700 comprises the double-sided organic EL display 300 provided with a first optical shutter 550 on a first surface, and a second optical shutter 580 disposed on a second surface of the double-sided organic EL display 300.

The second optical shutter 580 is substantially identical to the first optical shutter 550 included in the double-sided organic EL display 300 according to the first embodiment of the present invention. Here, the second optical shutter 580 is arranged symmetrically to the first optical shutter 550 so that the light from the double-sided organic EL display 300 is transmitted through, or blocked by, the first surface or the second surface.

With this configuration, in the double-sided organic EL display 700 according to the second embodiment of the present invention, when a user see the first surface in the state that the first optical shutter 550 is opened, the second optical shutter 580 prevents the light from being emitted from the organic EL device to the outside and at the same time prevents the external incident light at the second surface from being projected onto the first surface, thereby showing a displayed image clearer. Thus, according to the second embodiment of the present invention, the display is improved in visual recognition.

Thus, the double-sided organic EL display according to the second embodiment of the present invention comprises the first optical shutter and/or the second optical shutter in a single side and/or double sides thereof, thereby increasing mechanical strength of the display. Even though the number of layers is increased, the display according to the present invention employs a relatively thin substrate as compared with the conventional display, thereby decreasing the thickness T of the display.

Figure 6:
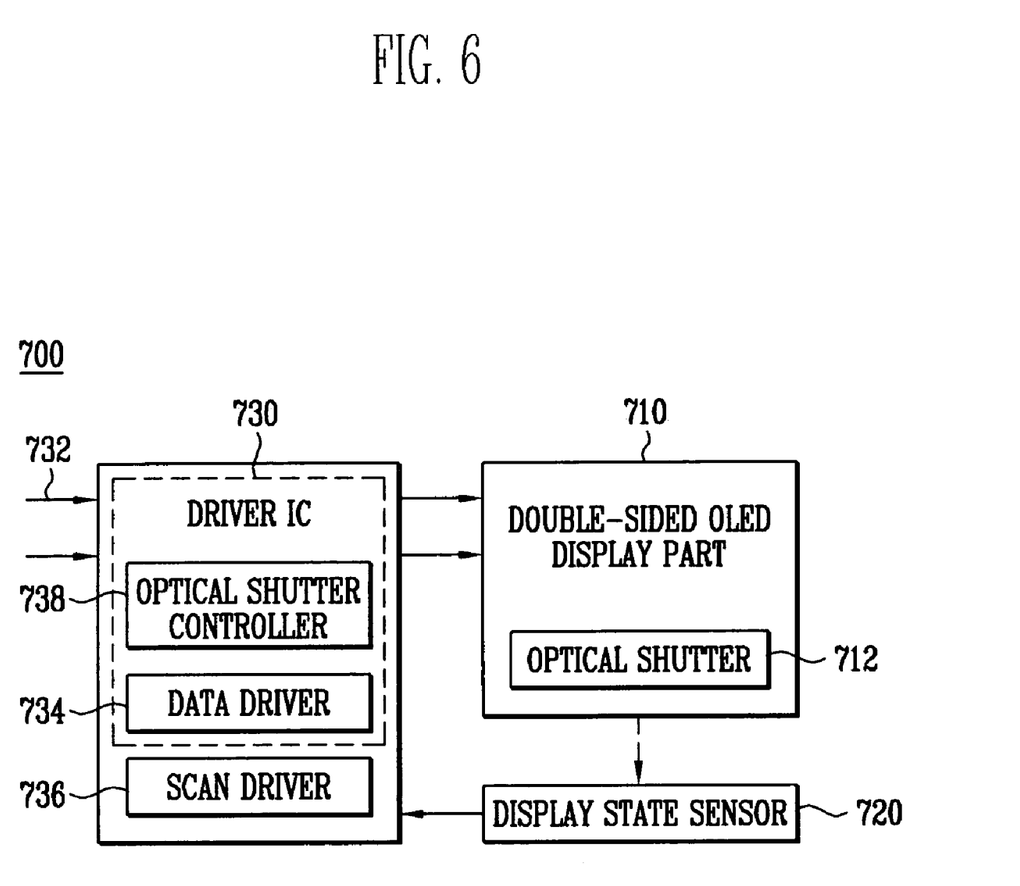
FIG. 6 is a control block diagram of the double-sided organic EL display according to the second embodiment of the present invention.

FIG. 6 is a control block diagram of the double-sided organic EL display according to the second embodiment of the present invention.

Referring to FIG. 6, the double-sided organic EL display 700 comprises: a double-sided organic EL image displaying part (hereinafter, referred to as "image displaying part") 710 having optical shutters 712, which are provided in the opposite sides of the image displaying part 710 and transmit or block the light from the organic EL device provided in the image displaying part 710; a display state sensor 720; a driver IC 730, and a scan driver 736. The double-sided organic EL display 799 may further comprise a timing controller (not shown) for controlling the image displaying part 710, and a power supply such as a DC-DC converter for supplying power.

The image displaying part 710 comprises a first screen and a second screen for displaying an image at the double sides. The image displaying part 710 emits light through both the first and second screens. The optical shutter 712 comprises a first optical shutter and a second optical shutter placed in the first and second screens, respectively. Here, the first optical shutter and the second optical shutter correspond to the first optical shutter 550 and the second optical shutter 580, respectively, in FIGS. 3 and 5.

The display state sensor 720 selectively controls the first and second optical shutters 712, wherein the sensor senses an on state of a front side or an on state of a back side of the first and second screens, respectively. For example, in the case of a display having a rotatable housing structure, the sensor preferably includes a slide switch provided in a hinge for the rotatable structure. Meanwhile, the display state sensor 720 is interlocked with a user interface provided as a menu for setting the display, for example, for selectively controlling the first and second optical shutters 712. This user interface will be described later with reference to FIG. 9.

The driver IC 730 generally comprises a controller (not shown) to supply image data for displaying an image on the image displaying part 710, and a control signal for controlling the image data. For this, the driver IC 730 comprises a data driver 734 supplying the image data for displaying an image on the image displaying part 710. Further, the driver IC 730 comprises the scan driver 736 to supply a selection signal for selecting the pixel to display an image on the image displaying part 710. Alternatively, the scan driver 736 may be provided in the image displaying part 710, not in the driver IC 730. Also, the driver IC 730 comprises an interface 732 to receive a video signal from the outside. Further, the driver IC 730 comprises an optical shutter controller 738 to control the optical shutter 712.

The optical shutter controller 738 applies a predetermined voltage to the first and/or second optical shutter in correspondence with a sensed signal from the display state sensor 720, thereby controlling the first and second optical shutter. For example, the optical shutter controller 738 controls the first and/or the second optical shutters to alternate between the transparentness or the opaqueness on the basis of the sensed signal transmitted from the display state sensor 720 as shown in the following <Table 1>.

TABLE 1

| | priority | First optical shutter | Second optical shutter |
|---|---|---|---|
| User interface | 1 | ON/Off | ON/Off |
| Slide switch | 2 | ON/Off | ON/Off |

Referring to <Table 1>, the optical shutter controller 738 controls the first and second optical shutter on the basis of the signal inputted from the slide switch and the user interface. Here, the slide switch indicates the display state sensor provided in a cover (not shown) or a hinge (not shown) of the double-sided organic EL display. Further, the user interface indicates an optical shutter setting means provided in the controller of the double-sided organic EL display and allowing a user to set the display.

In other words, the double-sided organic EL display according to the second embodiment of the present invention comprises a housing. Particularly, the double-sided organic EL display may comprise a rotatable housing such as a rotatable supporter, a cover, a casement, etc. In this case, the display state sensor according to the second embodiment of the present invention includes the slide switch provided in the hinge of the housing.

Further, the double-sided organic EL display according to the second embodiment of the present invention comprises the user interface to control the optical shutter. In this case, the user interface includes a set menu for allowing a user to set each of the optical shutters to be in either a transparent state or an opaque state (refer to FIG. 9).

Meanwhile, the double-sided organic EL display according to the second embodiment of the present invention comprises the power supply for supplying power to the image displaying part, the optical shutter, the driver IC, etc. Such a power supply and its connection can be appreciated by those skilled in the art, and thus detailed descriptions thereof will be omitted.

Figure 7:
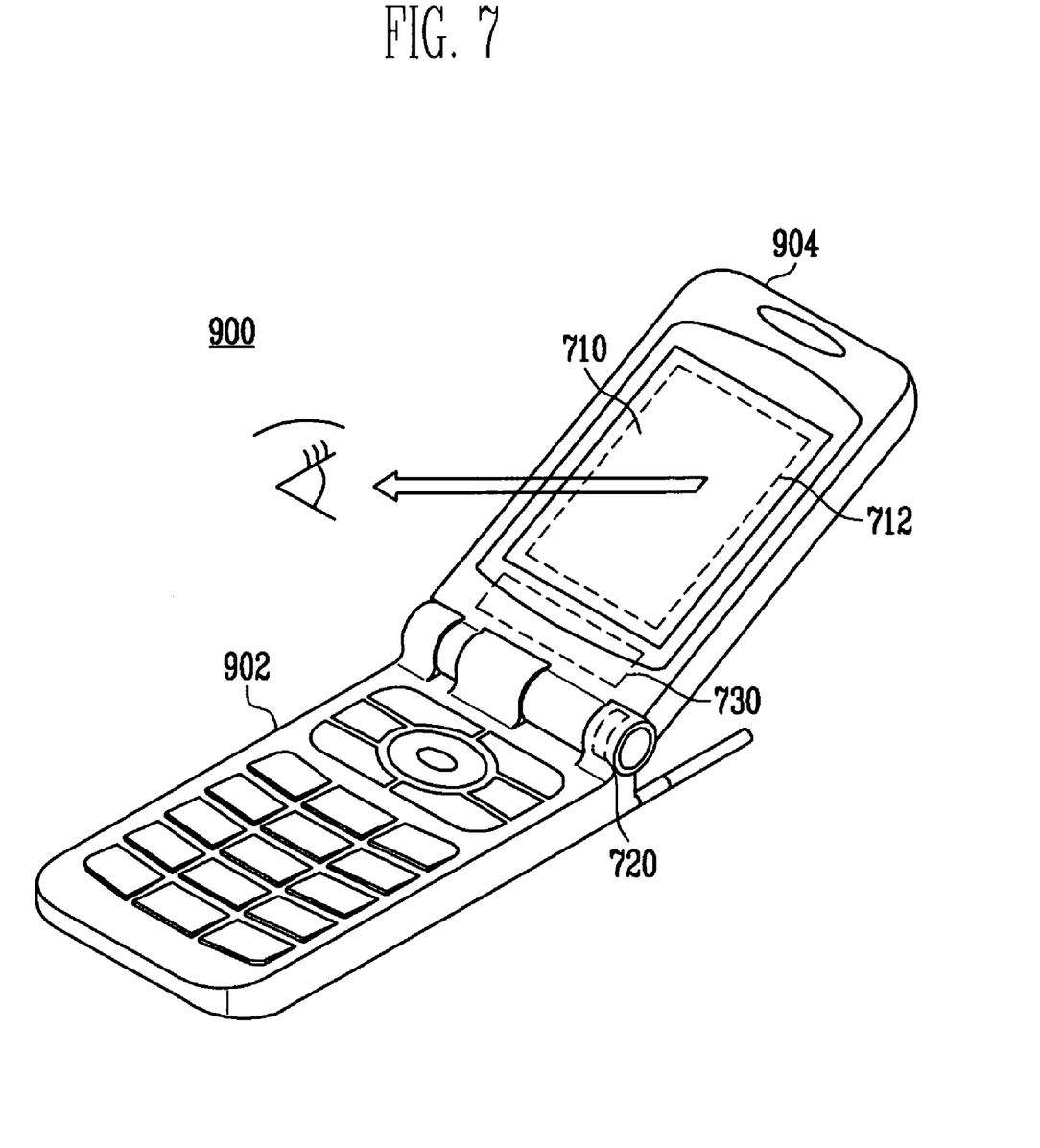
FIG. 7 is a perspective view of an information terminal according to a third embodiment of the present invention.
Figure 8:
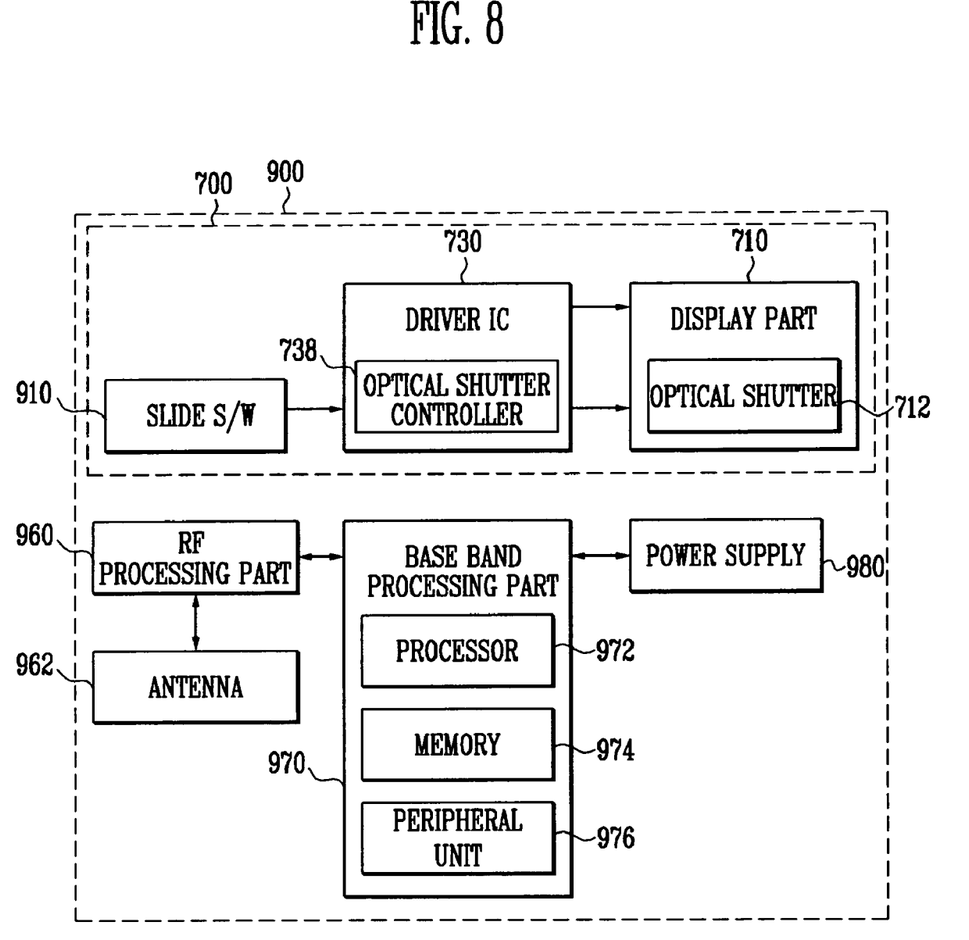
FIG. 8 is a control block diagram of the information terminal according to the third embodiment of the present invention.
Figure 9:
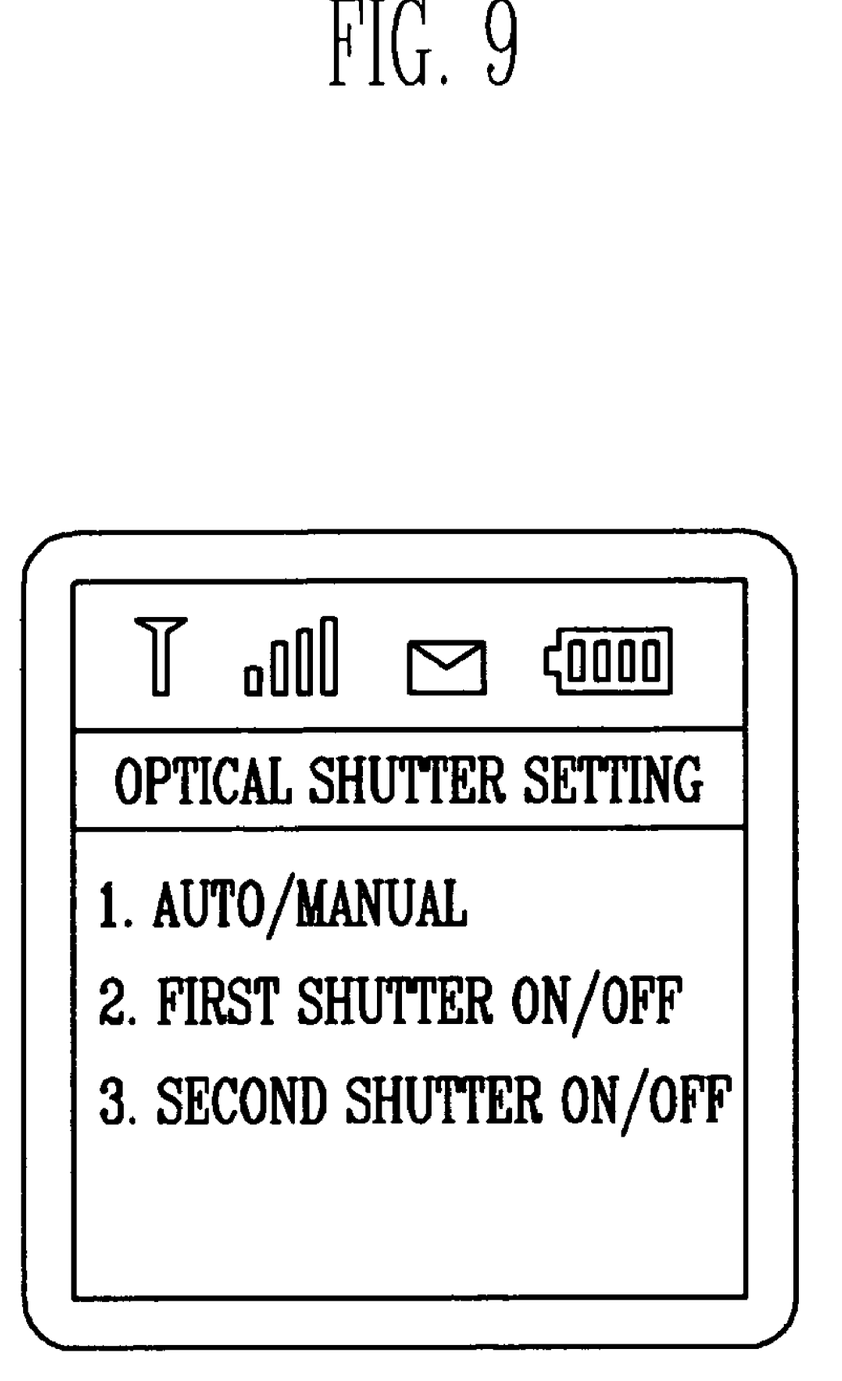
FIG. 9 is a view of a user interface for setting an optical shutter of the information terminal according to the third embodiment of the present invention.

An information terminal using a double-sided organic EL display according to a third embodiment of the present invention will be described with reference to FIGS. 7 through 9. FIG. 7 is a perspective view of an information terminal according to a third embodiment of the present invention; FIG. 8 is a control block diagram of the information terminal according to the third embodiment of the present invention; and FIG. 9 is a view of a user interface for setting an optical shutter of the information terminal according to the third embodiment of the present invention. By way of example, the information terminal is illustrated as a foldable mobile terminal.

Referring to FIGS. 7 and 8, an information terminal 900 comprises a body 902, a cover 904, an image displaying part 710, an optical shutter 712, a driver IC 730, a slide switch 910, a radio frequency (RF) processing part 960, an antenna 962, a base band processing part 970, and a power supply 980. The base band processing part 970 comprises a memory 974 to store information and a software program corresponding to various functions of the information terminal 900, etc.; and a processor 972 connected to the memory 974, implementing the software programs stored in the memory 974, and processing the input/output information of the memory 974 through a peripheral unit 976 such as a key pad or the like input/output devices. The processor 972 controls the peripheral unit 976, and controls the RF processing part 960 connected to the antenna 962 to wirelessly transmit/receive the information.

The slide switch 910 may be provided in a hinge between the body 900 and the cover 904. The slide switch 901 sends information about angle between the body 902 and the cover 904. On the basis of the information transmitted from the slide switch 901, the driver IC 730 controls the optical shutter controller 783 to make each of the first and second optical shutter be in either the transparent state or the opaque state.

For example, the driver IC 730 can be mounted as a chip-on-glass (COG) structure on the substrate of the image displaying part 710.

The image displaying part 710 comprises the first optical shutter 712 provided in a first side of the cover 904, and the second optical shutter (not shown) provided in a second side of the cover 904. In FIG. 7, the second optical shutter is placed in a backside of the cover 904, so that it is not shown.

For example, the first and second optical shutters are operated as follows. First, when the cover 904 is folded onto the body 902, the first optical shutter 712 is in the opaque state, and the second optical shutter is in the transparent state. On the other hand, when the cover 904 is opened from the body 902 as shown in FIG. 7, the first optical shutter 712 is in the transparent state, and the second optical shutter is in the opaque state. In the case where the second optical shutter is formed as an outside window of the mobile terminal, the second optical shutter is set to have the transparent state, the normally white (NW) mode of the liquid crystal, as a basic mode. With this configuration, the information terminal 900 enhances the visual recognition of the image displaying part 710 even though the circumferential luminous intensity thereof is high.

Further, the information terminal 900 includes the user interface as shown in FIG. 9. The user interface 990 is realized as one of user set menus provided in the information terminal such as a mobile terminal. In this case, a user can easily set the state of the first and second optical shutters by controlling a keypad provided in the information terminal. With this configuration, the present invention provides an information terminal which is excellent in convenience and visual recognition of an image on the screen.

In the foregoing embodiment, the mobile terminal is described as the information terminal, but not limited to. Alternatively, the information terminal may include a personal digital assistant (PDA), a PDA phone, a camcorder, a notebook computer, etc.

As described above, the present invention provides a double-sided organic electroluminescent display having an optical shutter, and an information terminal using the same, in which the optical shutter prevents an image in the back from being projected onto a front side.

Further, the present invention provides a double-sided organic electroluminescent display having an optical shutter, and an information terminal using the same, which are excellent in visual recognition even though circumferential luminous intensity is high.

Although a few embodiments of the present invention have been shown and described, it would be appreciated by those skilled in the art that changes might be made in this embodiment without departing from the principles and spirit of the invention, the scope of which is defined in the claims and their equivalents.

What is claimed is:

1. An organic electroluminescent display device, comprising:
    an image displaying part comprising a plurality of pixels to display an image corresponding to a data signal and a selection signal, with the displayed image being available for viewing from both sides of the image displaying part;
    an optical shutter provided on at least one of the sides of the image displaying part to transmit and block light in response to a control signal;
    a sensor transmitting a sensed signal representative of a detection by the sensor of an on-state of a front side of the image displaying part and a detection by the sensor of an on-state of a back side of the image displaying part; and
    a driver circuit responding to the sensed signal by supplying the data and selection signals to the plurality of pixels and the control signal to the optical shutter.

2. The organic electroluminescent display device according to claim 1, further comprising a housing to accommodate the image displaying part, the optical shutter, and the driver circuit.

3. The organic electroluminescent display device according to claim 2, wherein the sensor comprises a slide switch provided in the housing to output the sensed signal.

4. The organic electroluminescent display device according to claim 1, wherein the optical shutter comprises at least one of a polarizing modulation type liquid crystal, a scattering type liquid crystal, and an absorbing type liquid crystal.

5. The organic electroluminescent display device according to claim 1, wherein the optical shutter comprises:
    first and second glass substrates facing each other;
    first and second transparent electrodes formed between the first and second glass substrates;
    first and second alignment layers formed between the first and second transparent electrodes; and
    a liquid crystal being filled in a cell formed between the first and second alignment layers.

6. The organic electroluminescent display device according to claim 1, wherein the optical shutter comprises a first optical shutter and a second optical shutter disposed on opposite corresponding surfaces of the image displaying part.

7. An organic electroluminescent display device, comprising: an image displaying part comprising a plurality of pixels to display an image corresponding to a data signal and a selection signal, with the displayed image being available for viewing from both sides of the image displaying part;
    first and second optical shutters respectively provided on a first side and a second side of the image displaying part to transmit and block light in response to a control signal;
    a sensor transmitting a sensed signal representative of a detection by the sensor of an on-state of a front side of the image displaying part and a detection by the sensor of an on-state of a back side of the image displaying part; and
    a driver circuit responding to the sensed signal by supplying the data and selection signals to the plurality of pixels and the control signal to the optical shutter.

8. The organic electroluminescent display device according to claim 7, further comprising a housing to encase the image displaying part, the first and second optical shutters, and the driver circuit.

9. The organic electroluminescent display device according to claim 8, wherein the sensor comprises a slide switch provided in the housing to output the sensed signal.

10. The organic electroluminescent display device according to claim 7, wherein each of the optical shutters comprises:
    first and second glass substrates facing each other;
    first and second transparent electrodes formed between the first and second glass substrates;
    first and second alignment layers formed between the first and second transparent electrodes; and
    a liquid crystal filled in a cell formed between the first and second alignment layers.

11. An information terminal, comprising:
    a double-sided organic electroluminescent image displaying part comprising a plurality of pixels to display images corresponding to a data signal and a selection signal, with the displayed images being available for viewing from both sides of the image displaying part;

an optical shutter disposed on at least one of the sides of the image displaying part to transmit or block light in dependence upon a control signal;

a sensor transmitting a sensed signal representative of a detection by the sensor of an on-state of a front side of the image displaying part and a detection by the sensor of an on-state of a back side of the double-sided organic electroluminescent image displaying part;

a driver circuit responding to the sensed signal by transmitting the data and selection signals to the plurality of pixels and the control signal to the optical shutter, respectively;

a base band processing part comprising a memory to store a predetermined program, and a processor connected to the memory to implement the program; and a radio frequency processing part connected between the base band processing part and an antenna.

12. The information terminal of claim 11, wherein the optical shutter comprises:

first and second glass substrates facing each other;

first and second transparent electrodes formed between the first and second glass substrates;

first and second alignment layers formed between the first and second transparent electrodes; and a liquid crystal filled in a cell formed between the first and second alignment layers.

13. The information terminal according to claim 11, wherein the information terminal is one of a mobile phone, a personal digital assistant (PDA), a PDA phone, a camcorder, and a notebook computer.

14. The information terminal of claim 11, wherein the optical shutter comprises a first optical shutter provided on the first side of the image displaying part, and a second optical shutter provided on the second side of the image display part.

15. The information terminal according to claim 11, further comprising a user interface to switch the optical shutter between opaque and transparent states with a higher priority compared to the sensor.

16. The information terminal according to claim 15, wherein the sensor is interlocked with the user interface.

17. The information terminal according to claim 11, wherein the information terminal has a rotatable structure, and the sensor detects a rotation of the rotatable structure to control the optical shutter according to the detected rotation.

* * * * *